United States Patent
Dadafshar

(10) Patent No.: US 6,628,531 B2
(45) Date of Patent: Sep. 30, 2003

(54) MULTI-LAYER AND USER-CONFIGURABLE MICRO-PRINTED CIRCUIT BOARD

(75) Inventor: Majid Dadafshar, Escondido, CA (US)

(73) Assignee: Pulse Engineering, Inc., San Diego, CA (US)

( * ) Notice: Subject to any disclaimer, the term of this patent is extended or adjusted under 35 U.S.C. 154(b) by 0 days.

(21) Appl. No.: 09/735,030

(22) Filed: Dec. 11, 2000

(65) Prior Publication Data

US 2002/0070834 A1 Jun. 13, 2002

(51) Int. Cl.⁷ .................................................. H05K 7/00
(52) U.S. Cl. ................. 361/836; 361/298.4; 361/299.2; 336/200
(58) Field of Search ................... 361/268, 299.2, 361/298.2, 298.3, 298.4, 836; 336/192, 200, 150, 182, 180; 323/346; 174/265

(56) References Cited

U.S. PATENT DOCUMENTS

| 3,657,494 | A | | 4/1972 | Gargini |
| 3,728,656 | A | * | 4/1973 | Neuber ........................ 323/346 |
| 3,765,082 | A | | 10/1973 | Zyetz |
| 4,873,757 | A | * | 10/1989 | Williams .................... 29/602.1 |
| 5,020,377 | A | | 6/1991 | Park |
| 5,179,365 | A | | 1/1993 | Raggi |
| 5,251,108 | A | | 10/1993 | Doshita |
| 5,521,573 | A | | 5/1996 | Inoh et al. |
| 5,552,756 | A | | 9/1996 | Ushiro |
| 5,724,016 | A | | 3/1998 | Roessler et al. |
| 5,777,277 | A | * | 7/1998 | Inagawa ....................... 174/265 |
| 5,777,539 | A | | 7/1998 | Folker et al. |
| 5,781,093 | A | | 7/1998 | Grandmont et al. |
| 5,880,662 | A | | 3/1999 | Person et al. |
| 5,952,909 | A | * | 9/1999 | Umeno et al. .............. 29/602.1 |
| 6,023,214 | A | * | 2/2000 | Ohta et al. ................... 336/200 |
| 6,239,683 | B1 | * | 5/2001 | Roessler et al. ............ 336/200 |

FOREIGN PATENT DOCUMENTS

| EP | 0 435 461 | 11/1990 |
| EP | 90312879.1 | 11/1990 |
| EP | 0 601 791 | 1/1993 |
| EP | 0 741 395 | 4/1996 |

\* cited by examiner

Primary Examiner—Kamand Cuneo
Assistant Examiner—Tuan Dinh
(74) Attorney, Agent, or Firm—Knobbe Martens, Olson & Bear LLP

(57) ABSTRACT

A multi-layer micro-printed circuit board (PCB) is disclosed, which defines a magnetic component, such as a transformer, using planar technology. Instead of using the traditional twelve-layer PCB incorporating both a primary and a secondary winding, this invention stacks multiple PCBs, each having four or six layers and each including a single winding (either the primary or the secondary). The PCBs are stacked in an offset arrangement such that the pins penetrating the PCB or PCBs including the primary winding or windings do not penetrate the PCB or PCBs including the secondary winding or windings. Additionally, this offset arrangement prevents the pins penetrating the secondary PCBs from penetrating the primary PCBs in the same manner. This offset configuration thereby avoids significant flashover problems associated with current planar components. Moreover, the invention describes an arrangement whereby a jumper or other connection can be used to connect the windings in a series or in a parallel configuration allowing the user to configure the component according to user-required parameters.

11 Claims, 10 Drawing Sheets

MULTI-LAYER AND USER-CONFIGURABLE MICRO-PRINTED CIRCUIT BOARD

FIELD OF THE INVENTION

The invention relates generally to miniature printed circuit boards (PCB) for microelectrical applications. More particularly, the invention relates to multi-layer, user configurable and stackable miniature printed circuit boards for static electromagnetic components such as transformers.

DESCRIPTION OF THE RELATED TECHNOLOGY

Transformers are widely known electromagnetic components used in electrical devices and power supply units. In general, static magnetic components such as transformers have traditionally been constructed using windings of ordinary conducting wire having a circular cross section. The conventional transformer comprises an insulator gap between a primary coil and a secondary coil, and the voltage generated in the secondary coil is determined by the voltage applied to the primary coil multiplied by the winding ratio between the primary coil and the secondary coil. Manufacture of these traditional structures involves winding the wire around a core or bobbin structure, a process that often involves considerable amounts of expensive hand labor. Furthermore, high power applications often require a magnetic component having a bulky core and large wire sizes for the windings. Even though the transformer is often an essential component of an electrical apparatus, it has been historically the most difficult to miniaturize.

New operational requirements with respect to circuit size and power density and the increasing necessity to reduce circuit manufacturing costs have made the traditional static magnetic component very unattractive as a circuit component. Newly designed circuits, for example, need low profiles to accommodate the decreasing space permitted to power circuits. Attaining these objectives has required the redesign of magnetic components to achieve a low profile and a low cost component assembly.

Planar magnetic components fabricated with flexible circuit and multi-layer printed circuit board (PCB) technologies offer an alternative to address the new operational and cost requirements. With planar technology, transformers have been formed from single or multi-layered printed circuit boards. FIG. 1A illustrates an example of a typical planar transformer constructed from printed circuit boards. Specifically, FIG. 1A depicts a side view of such a component 100 attached to the main board 110 of an electrical device. The component 100 includes a PCB 130 with multiple internal layers. Windings of the PCB 130 are connected to the main board by connecting pins 140. FIG. 1B illustrates the manner in which the component 100 is assembled and FIG. 2 schematically depicts the individual layers of the PCB 130.

The basic construction of the component 100 comprises a spiral conductor on each layer of the PCB 130 forming one or more inductor "turns." As shown in FIG. 1B, the core 120 can comprise two separate and identical E-shaped sections 122 and 124. Each E-shaped section 122, 124 includes a middle leg 126 and two outer legs 128. A hole 132 is drilled in the center of the PCB 130. The middle leg 126 of the E-shaped section 122, 124 can be supported within the hole 132 to form part of the core 120. The middle leg 126 has a circular cross-section and each of the outer legs 128 has a circular or rectangular cross-section. The remaining section of the E-shaped sections 122, 124 is formed by a ferrite bar, which is bonded to the legs 126, 128. The E-shaped sections 122, 124 are assembled so that the legs 126, 128 of each E-shaped section are bonded together. Primary and secondary pins connecting the primary and secondary windings, respectively, can penetrate the PCB via terminal holes 134 drilled near the outer edges of the PCB as will be explained below.

The width of the spiral conductor depends on the current carrying requirement. That is, the greater the current carrying requirement, the greater the width of the conductor. Typically, a predetermined area is reserved for the inductor and the one or more turns are printed on each layer according to well known printed circuit board technology. (See, for example, U.S. Pat. No. 5,521,573.) After each layer is so printed, the layers are bonded together into a multi-layer PCB by glass epoxy. Through-hole "vias" or blind "vias" are used to interconnect the turns of the different layers.

A through-hole via is formed by drilling a hole through the layers at a position to intersect ends of two of the spiral conductors and then "seeding" the inner surface of the holes with a water soluble adhesive. Next, copper is electrolessly plated on the adhesive to interconnect the conductors. Next, additional copper is electrically plated over the electroless copper plate to the desired thickness. Finally, the holes are filled with solder to protect the copper plate. A separate via is required for each pair of spiral conductors on adjacent layers to connect all of the turns in series. Each such through-hole via is positioned not to intersect the other conductors.

Drilling holes in selected layers before the layers are bonded together forms a "blind" via. Then, the layers are successively bonded together and, while exposed, the inner surface of the holes is seeded with nickel, electrolessly plated with copper and then filled with solder. The resultant vias extend between the two layers sought to be electrically connected. Thus, the hole does not pass through other layers, and no area is required on these other layers to clear the via. However, the blind via fabrication process is much more expensive than the through-hole fabrication process. As shown in FIG. 1A, primary pins 140 connecting the primary windings and secondary pins 150 connecting the secondary windings are then positioned to penetrate the multi-layer PCB 130.

FIG. 2 illustrates a process for manufacturing a printed coil with conventional planar technology in a PCB. In the layers of the PCB of FIG. 2, a primary winding and secondary winding can be formed by connecting multiple coil traces from five layers 200, 220, 240, 260, and 280. The primary winding, for example, can have an outside terminal 202 connected to a coil trace 204 on layer 200. The inside terminal of the coil trace 204 can be connected to an inside terminal of a connection trace 242 on layer 240 by an inner peripheral terminal 208 through a via. The outside terminal of the connection trace 242 is connected by a primary terminal 210 through a via to an outside terminal 282 of a coil trace 284 on layer 280. The inner terminal of the coil trace 284 is connected to the inner terminal of connection trace 244 on layer 240 by a peripheral terminal 286 through a via. Connection trace 244 is connected to outside terminal 246, thereby forming a primary winding between outside terminals 202 and 246 from coil traces 204 and 284 on layers 200 and 280, respectively.

A secondary winding can be formed by connecting a coil trace 224 on layer 220 and a coil trace 264 on layer 260 in a similar fashion. An outside terminal 262 of coil trace 264 can be connected through a via to a corresponding outside terminal 222 of coil trace 224 by a primary terminal 266. The inside terminal of coil trace 224 is connected to the inside terminal of coil trace 284 through a via by peripheral terminal 226. Because the inside terminal of each coil trace 224 and 264 is connected and the outside terminals of each coil trace 224 and 264 is connected, the coil trace 224 and the coil trace 264 are connected in parallel.

FIG. 3 illustrates a typical twelve-layer layout where each individual layer is shown separately. These layers can be connected in a fashion similar to that described above with reference to FIG. 2 to form a PCB having a primary winding and a secondary winding. In this conventional layout, a twelve layer PCB includes traces of both the primary and secondary windings as similarly described with reference to FIG. 2. However, as a result, the primary and secondary windings are physically positioned near one another, creating significant risks of electrical flashover.

FIG. 4 schematically illustrates how a primary winding and a secondary winding from a PCB can be arranged as a transformer. Referring again to FIG. 2, the windings traced on the layers of a PCB can form a primary winding with external terminals 202 and 282 and a secondary winding with external terminals 226 and 262. As shown in FIG. 4, a primary winding 420 can be connected to the main board 110 by pins 430 and 440 at terminals 202 and 282. A secondary winding 460 can be connected to the main board 110 by pins 470 and 480 at terminals 226 and 262. The primary winding 420 is configured across from the secondary winding 460 with the dielectric material of the core 120 positioned therebetween and represented by lines 490.

While a considerable improvement over traditional construction of magnetic components, these arrangements still fail to meet the performance and cost objectives of contemporary circuit designs. In particular, this conventional planar arrangement poses significant design, cost, and operational disadvantages.

As discussed above, applications today are increasingly demanding space restrictions for their design. Consequently, efforts are continuing to further reduce the size of electrical components. Power supplies, for example, have been significantly reduced in size over the past few years. As a result, the space available for the planar magnetic component is extremely limited. Therefore, the current twelve layer arrangement in conventional planar technology offers a significant obstacle to miniaturizing circuit designs.

Closely tied to the current and ongoing size constraints are the ever-increasing demands for less expensive and more reliable applications. The conventional twelve-layer planar components also prove to be extremely costly. The conventional planar magnetic component must be customized for each circuit design depending on the parameters required (e.g., the turn ratio). If the parameters change, then a new planar magnetic component must be custom manufactured. Manufacture of the magnetic components using conventional planar technology therefore requires substantial costs associated with each new PCB configuration built for each and every circuit parameter change.

Moreover, the current planar technology raises serious operational problems associated with high potential (HIPOT) applications as well. The pins in the conventional boards penetrate the PCB layers in various locations and generally propagate through the thickness of most or all of the layers; however, only certain pins are electrically bonded to certain layers. Because of the manner in which the pins in the conventional planar components fully penetrate the boards in various locations, with only certain pins electrically bonded to certain layers, significant risks of failure due to an electrical flashover exist. Lastly, such many layer boards require significant pressure to laminate them together, thereby generally creating higher shear forces on the layers during manufacture. The resulting lateral movement of each individual layer relative to the layers above and below can cause significant defects to the operation of the component and, in particular, can infringe the minimum space needed between primary and secondary windings.

Accordingly, there is a need for a static electro-magnetic component which not only satisfies demanding operational and size requirements of current electronic technology but also avoids the flashover problems and high costs of the current planar technology. Furthermore, there is a need for an electrical device which offers the additional benefit of providing a configurable and customizable capability allowing a user to change parameters of the component to suit the needs of a particular application.

SUMMARY OF THE INVENTION

The embodiments of the invention described below offer a multi-layer and user-configurable PCB device which can function as a transformer. The novel arrangement of this invention along with its customizable configuration overcome the disadvantages and problems associated with the prior art, which were discussed above.

The invention generally comprises a series of discrete stackable PCBs having predetermined trace layouts, such as those used for a cylindrical transformer core. These predetermined boards can be standardized, thereby eliminating the designer layout process. The user may configure the boards using variable position vias (pins) and jumpers such that the vias do not penetrate boards to which they are not electrically connected.

One embodiment of the invention comprises a plurality of core members and a plurality of printed circuit boards stacked into a multi-layer configuration between the core members. A first printed circuit board is configured to define a primary winding of a transformer. A second set of printed circuit boards is configured to define a secondary winding of a transformer. A connection member is configured to selectively connect the printed circuit boards of the secondary winding in either a parallel or a series electrical configuration depending on the needs of the user. Connector pins are configured to electrically connect the plurality of printed circuit boards to the main circuit board. Each connector pin penetrates only printed circuit boards containing the primary winding or the printed circuit boards containing the secondary winding.

In another embodiment, the invention comprises a method of manufacturing an electrical device including printing at least one coil on each of a plurality of printed circuit boards, configuring electrical connections on the plurality of printed circuit boards to include the coils on the printed circuit boards so as to define a primary winding and a secondary winding. The printed circuit boards are configured in a stacked arrangement, and the primary winding on the printed circuit boards and the secondary winding on the printed circuit boards are connected to a main circuit board with connector pins in such a manner that the connector pins connecting the primary winding only penetrate printed circuit boards containing the primary winding and connector pins connecting the secondary winding only penetrate printed circuit boards containing the secondary winding.

DETAILED DESCRIPTION OF THE INVENTION

The invention is best understood by reference to the figures wherein like parts are designated with like numerals throughout.

Figure 5:
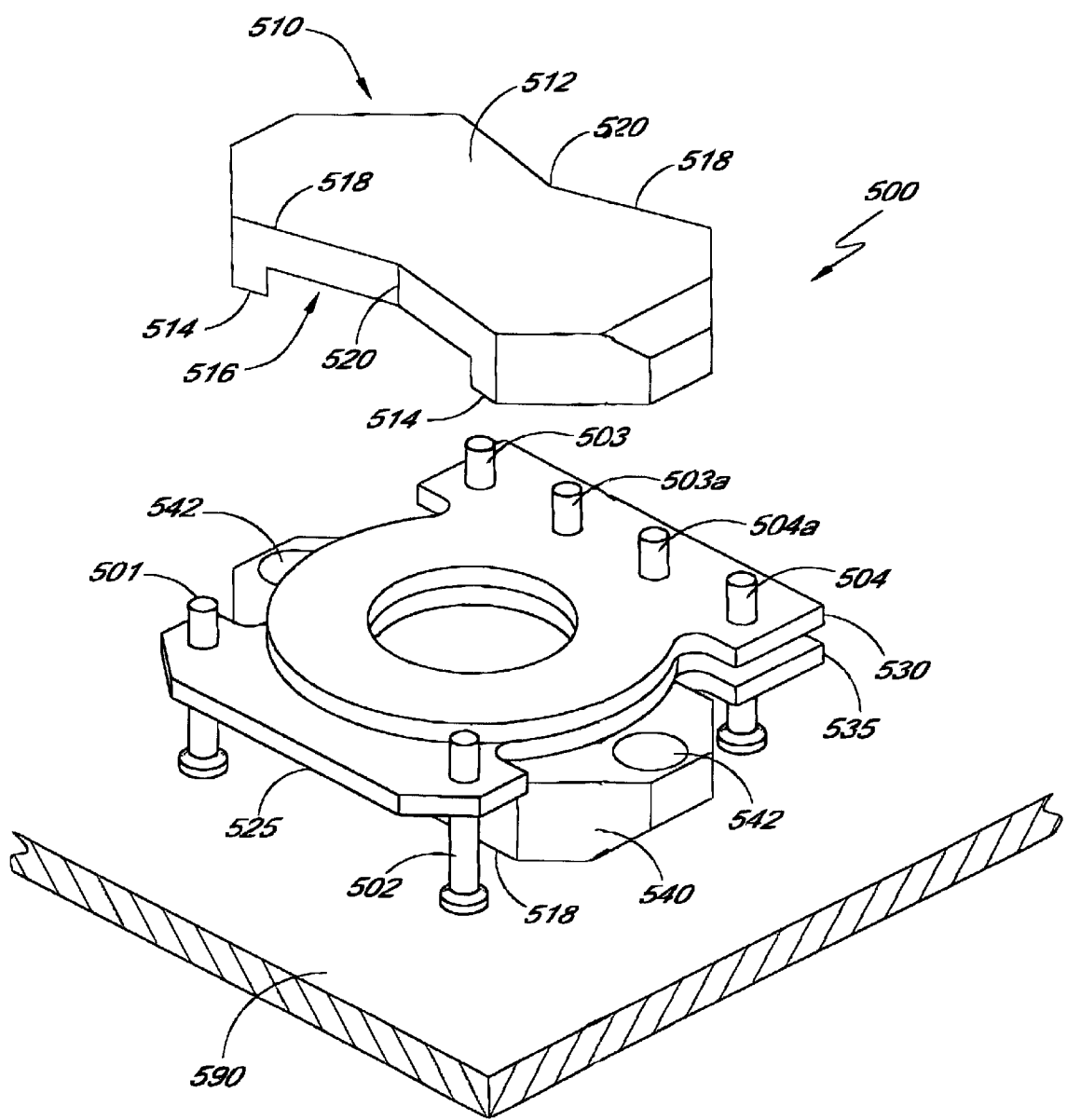
FIG. 5 is an exploded perspective view of a magnetic component showing an upper core portion removed.

FIG. 5 is an exploded perspective view of a magnetic component 500 with an upper core portion 510 separated from a lower core portion 540. The magnetic component 500 is configured as a transformer. One primary PCB 525 and two secondary PCBs 530 and 535, are laid onto the lower core portion 540. The three PCBs 525, 530, and 535 each have hollow centers to accommodate a cylindrical member (not shown) of the upper core portion 510 and a cylindrical member (not shown) of the lower core portion 540. Therefore, as the PCBs 525, 530, and 535 are placed on the lower core portion 540, the cylindrical member of the lower core portion 540 fits into the hollow centers of the PCBs 525, 530, and 535. Similarly, as the upper core portion 510 is placed on top of the lower core portion 540, the cylindrical member of the upper core portion 510 passes through the hollow centers of the PCBs 525, 530, and 535. In one embodiment, the core portions 510 and 540 and the cylindrical members passing through the hollow centers of the PCBs 525, 530, and 535 are manufactured from a ferrite material. Alternatively, the core portions 510 and 540 can be manufactured from other suitable materials.

Figure 1A:
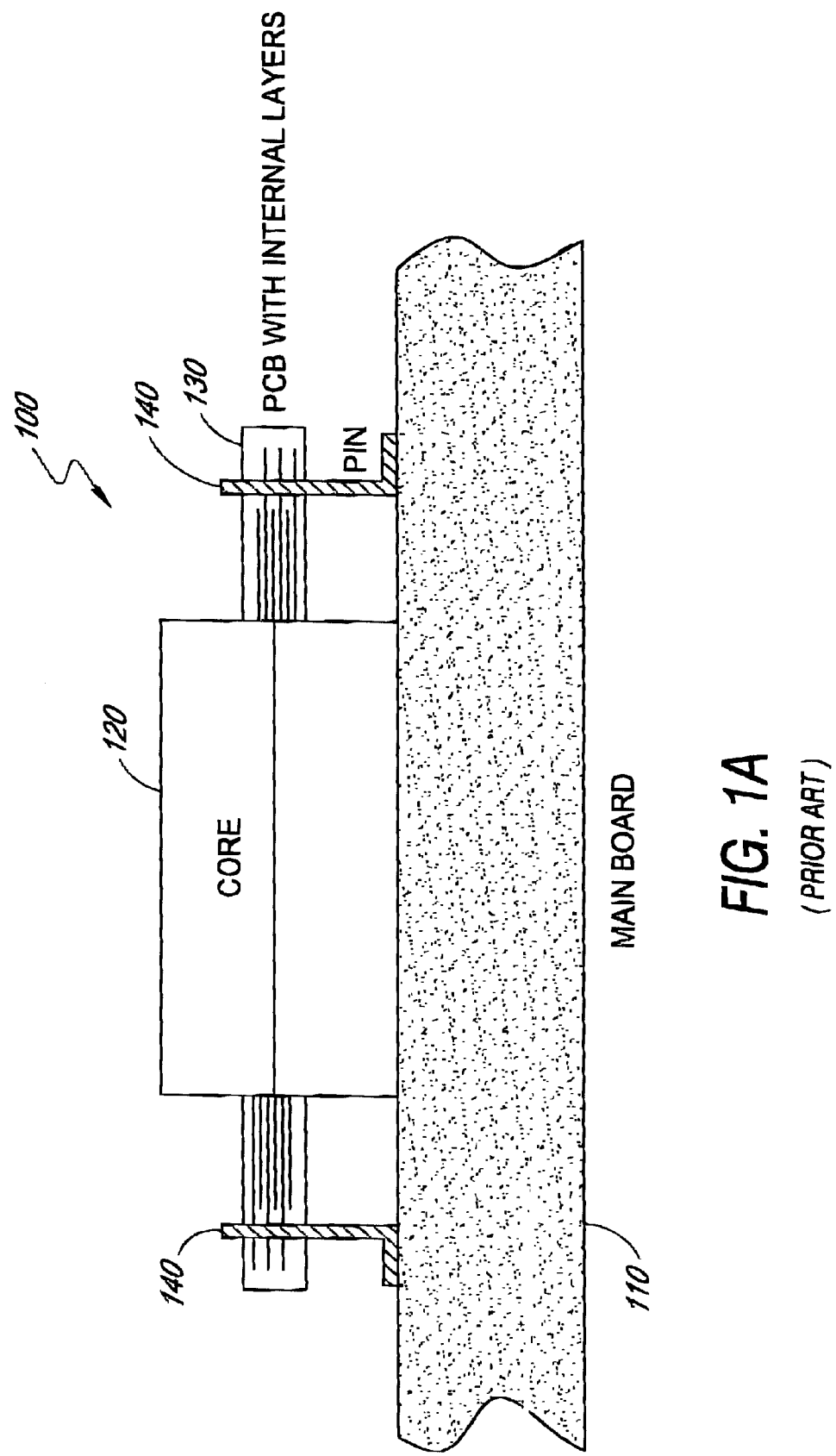
FIG. 1A is a side sectional view of a magnetic component employing the conventional planar technology.
Figure 1B:
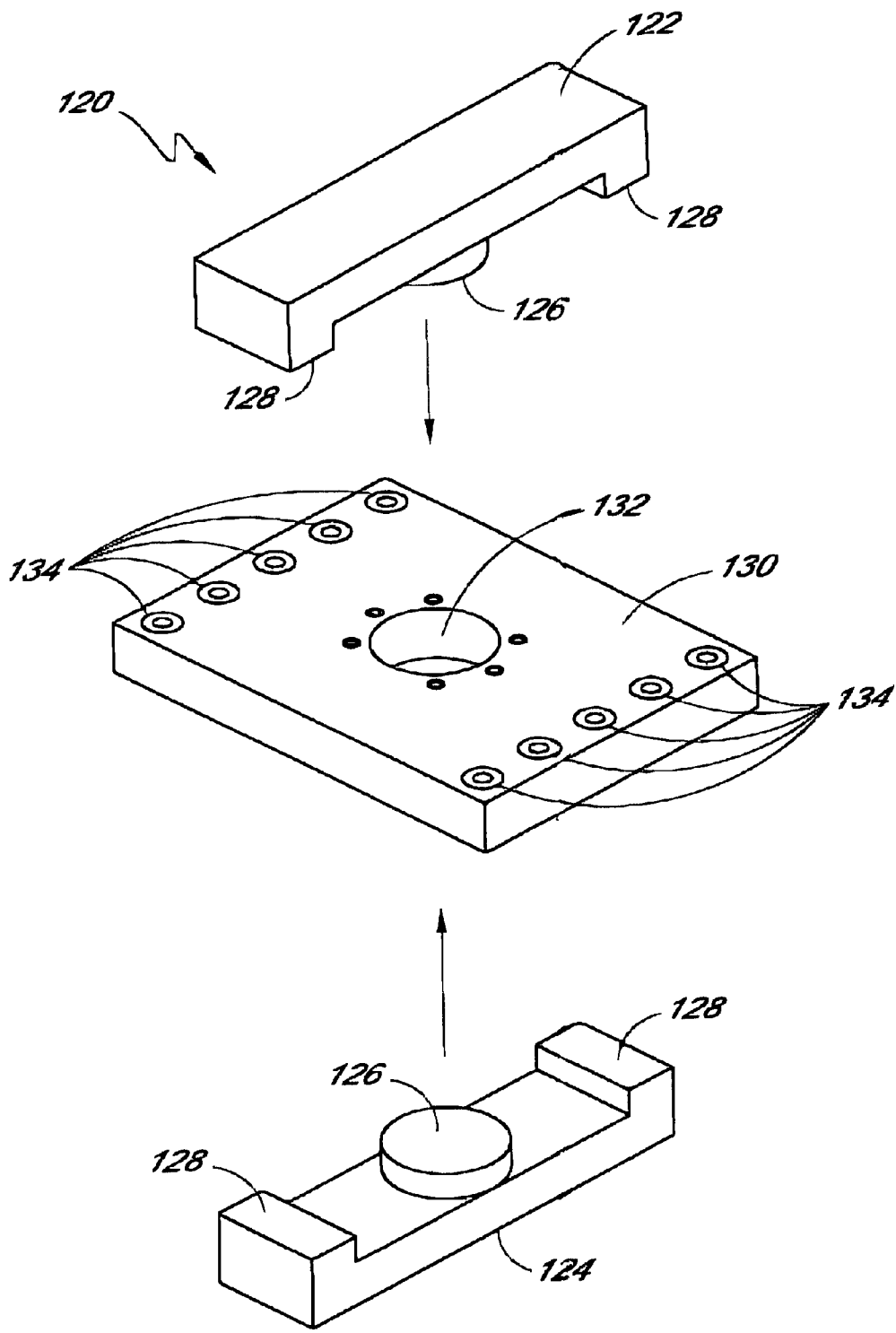
FIG. 1B is an exploded perspective view of the magnetic component of FIG. 1A.

The upper core portion 510 is configured with a flat outer surface 512. The surface opposite the flat outer surface 512 is configured with two support members 514 on opposing ends of the upper core portion 510 thereby forming a gap 516 therebetween. The support members 514 run the width of the upper core portion 510 and consequently, the gap 516 also runs the width of the upper core portion 510. The cylindrical member (not shown) of the upper core portion is centered in the gap 516 of the surface opposite the flat outer surface 512. This configuration resembles the "E-shape" of the cores used in the conventional planar technology described above and depicted in FIG. 1B. Edges 518 of the upper core portion 510 and lower core portion 540 are configured with a cornered indent 520 (not shown in lower core portion 540) to accommodate connecting pins described below.

The lower core portion 540 is configured to substantially define a mirror image of the upper core portion 510. The upper core portion 510 can then be secured to the lower core portion 540 by an adhesive placed on surfaces 542 of the support members of the lower core portion 540. When the support members 514 of the core portions 510 and 540 are mated together at surfaces 542, the cylindrical member (not shown) of the upper core portion is then positioned to pass through the hollow centers of the PCBs 525, 530, and 535.

Figure 6:
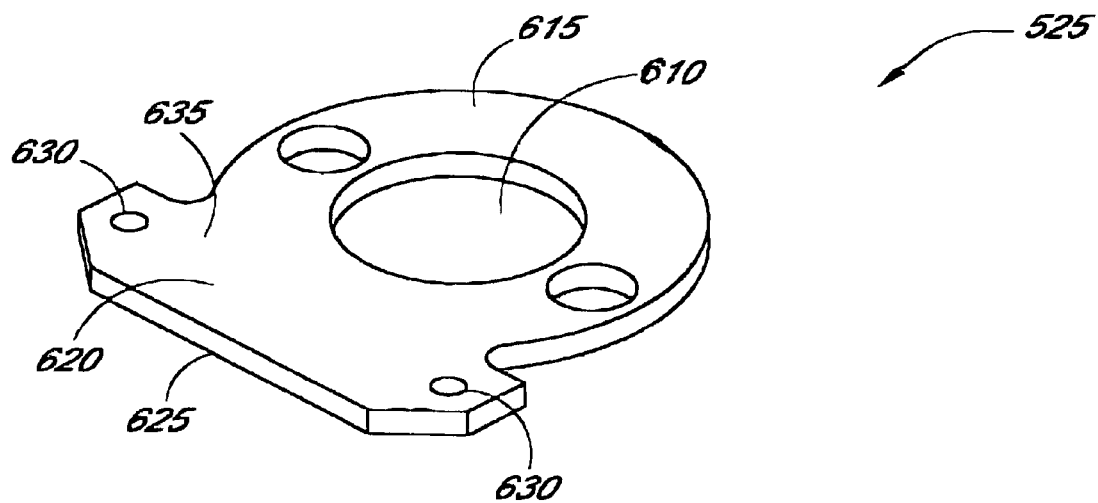
FIG. 6 is an exploded perspective view of a primary PCB including a primary winding and a secondary PCB including a secondary winding.
Figure 6:
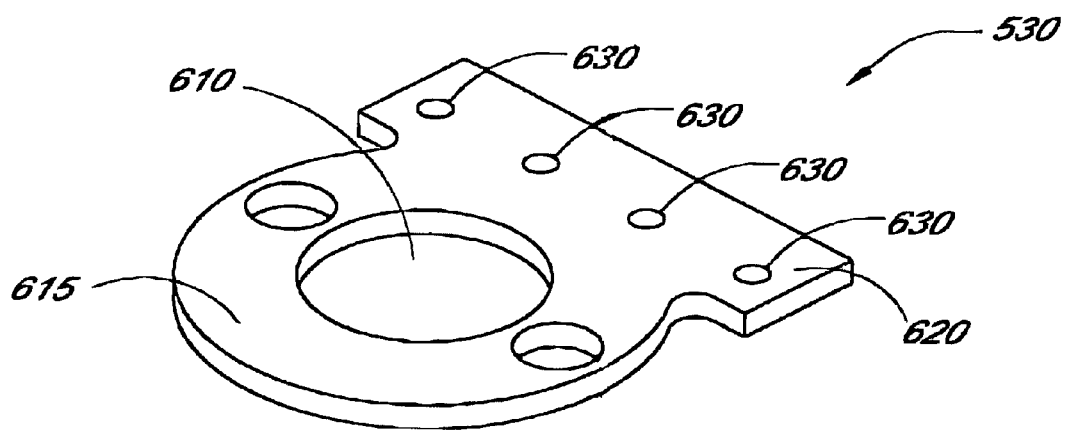

As shown in FIG. 6, the primary PCB 525 and the secondary PCB 530 each are generally formed as flat boards. Each of the PCBs 525 and 530 has a circular portion 615 which is substantially circular in shape with a hollow center 610. As described above, the diameters of the hollow centers 610 of the PCBs 525 and 530 are substantially equal and can accommodate the diameter of the cylindrical member of the upper core portion 510. Each of the PCBs 525 and 530 has a rectangular portion 620 which is substantially rectangular in shape with a leading edge 625 parallel to a tangent of the outer edge of the circular shape. The rectangular portion 620 has a width substantially as wide as the annuli of the circular portions of the PCBs 525 and 530. The rectangular portion 620 of each PCB 525, 530 also preferably includes a plurality of holes 630 to accommodate connecting pins. Moreover, each rectangular portion 620 provides a conductive surface through which pins connecting the PCBs 525, 530 can attach in order to connect winding traces.

Figure 7:
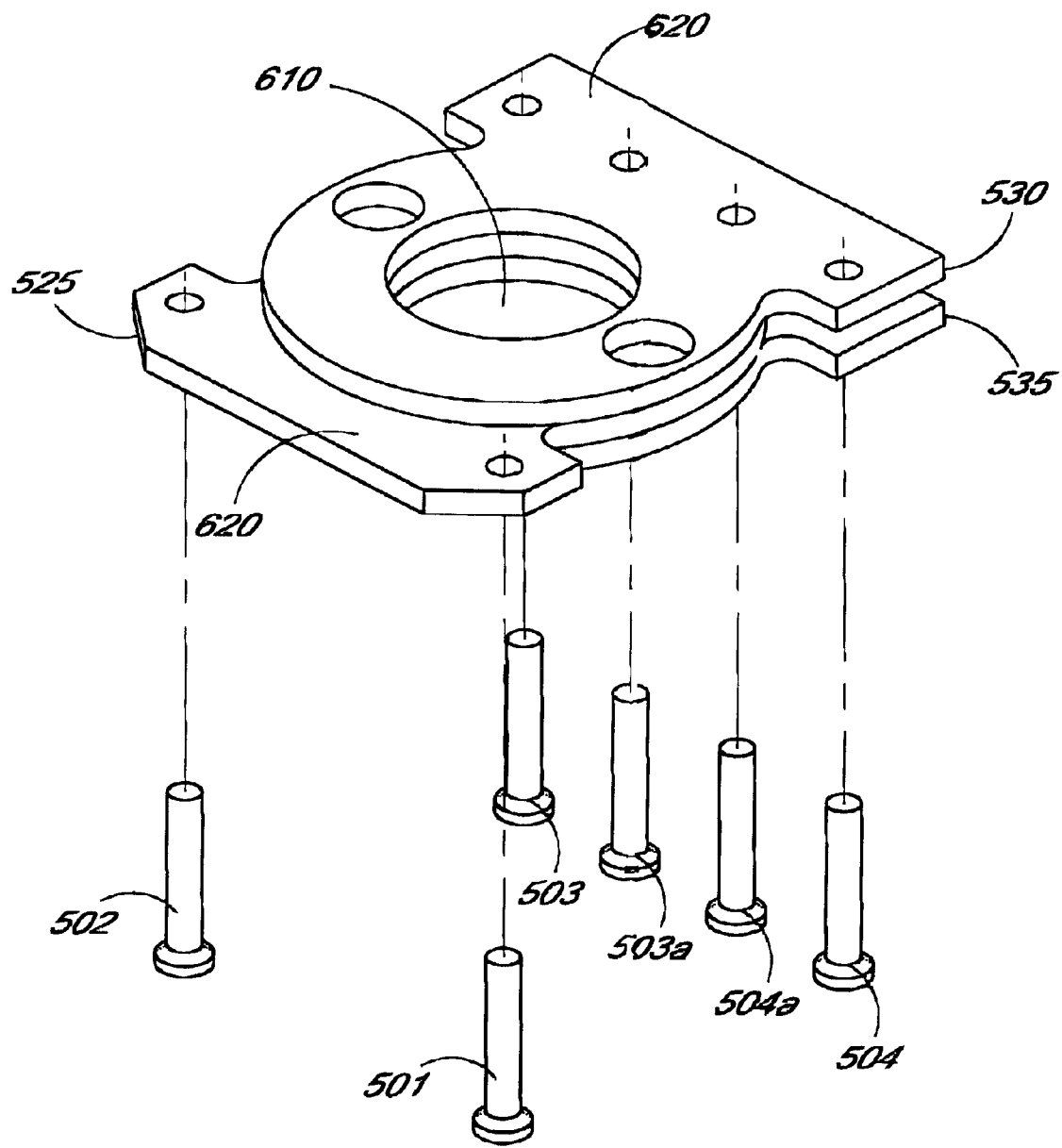
FIG. 7 is a perspective view of the primary PCB of FIG. 5 positioned between two secondary PCBs.

Referring to FIG. 7, six electrical conducting pins 501, 502, 503, 503A, 504, and 504A, can penetrate the stacked PCB layers 525, 530 and 535. Alternatively, more or fewer pins can be employed. The pins labeled 501 and 502 penetrate the primary PCB 525; pins 503, 503A, 504, and 504A penetrate the secondary PCBs, 530 and 535. The primary PCB 525 is positioned so that the rectangular portion 620 of the primary PCB 525 is directly opposite the rectangular portion 620 of the secondary PCBs 530 and 535. As a result of this configuration, the pins 501 and 502 only penetrate the primary PCB 525 and the pins 503, 503A, 504, and 504A only penetrate the secondary PCBs 530 and 535. Therefore, no physical or electrical connection exists between the primary windings and the secondary windings. As a result, the significant risks of failure due to an electrical flashover can be minimized. The pins 501, 502, 503, 503A, 504, and 504A act to connect the various outside terminals of the windings embedded in each PCB to a main circuit board 590.

Figure 8:
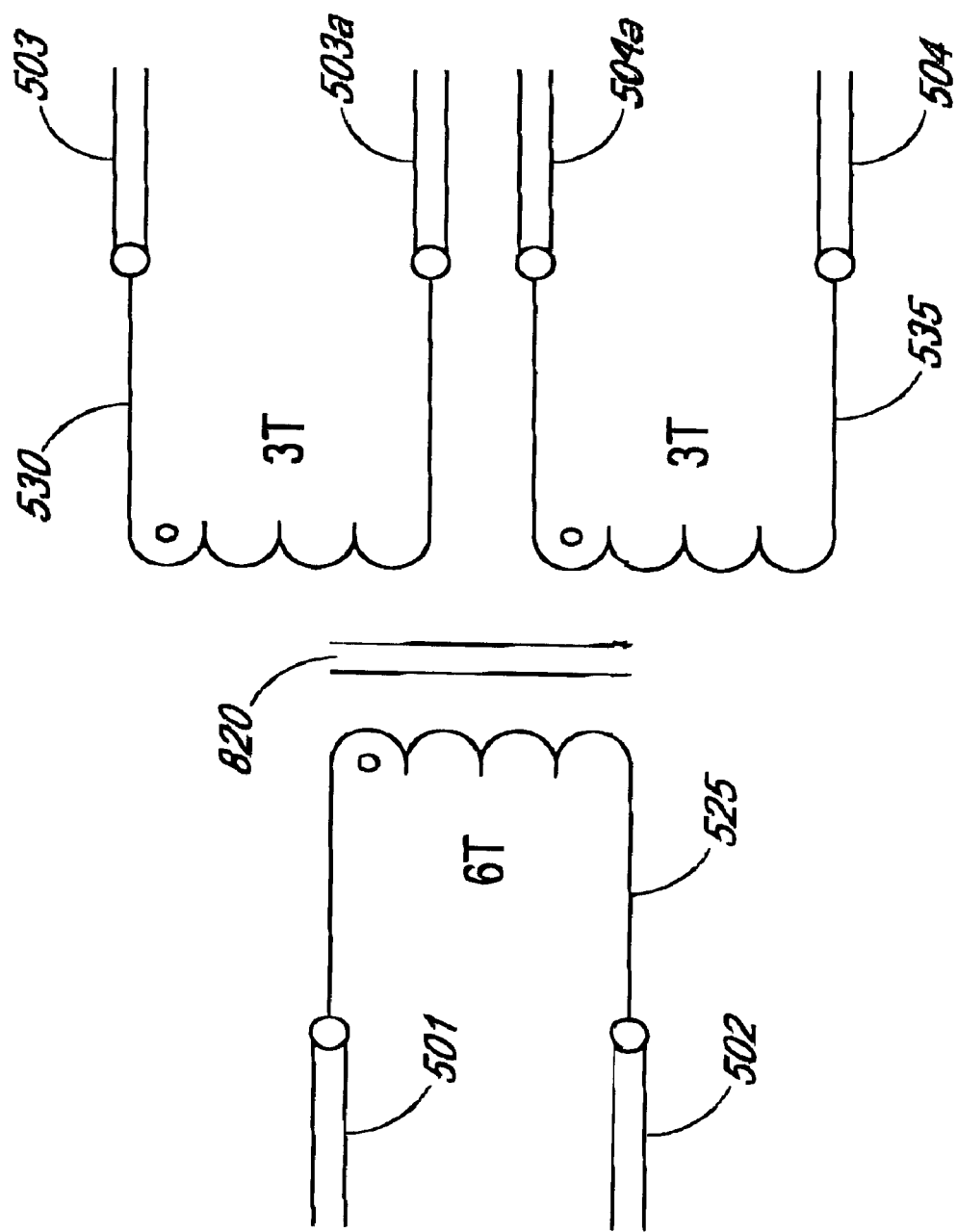
FIG. 8 is a schematic diagram of the equivalent circuit of the primary windings and secondary windings of the PCB of FIG. 6.

A schematic circuit diagram of the configuration of the magnetic component of FIG. 5 is illustrated in FIG. 8. In particular, pins 501 and 502 connect the windings of the primary PCB 525 which consists of six turns in this diagram. Pins 503 and 503A connect the windings of the secondary winding 430, which consists of three turns in this diagram. Lastly, pins 504 and 504A connect the windings of the secondary PCB 535, which also consists of three turns in this diagram. The dielectric of the core portions 510, 540 is represented by lines 820 passing in-between the turns of the primary PCB 520 and the primary PCBs 530 and 535. A user could easily re-configure this arrangement by replacing any one of these PCBs with another PCB wired with a different number of turns, thereby easily adjusting the turn ratio.

The magnetic component of FIG. 5 can be configured to define various turn ratios for a transformer. For example, FIGS. 9A and 9B illustrate a series configuration and a parallel configuration of the secondary PCBs 530 and 535.

Figure 2:
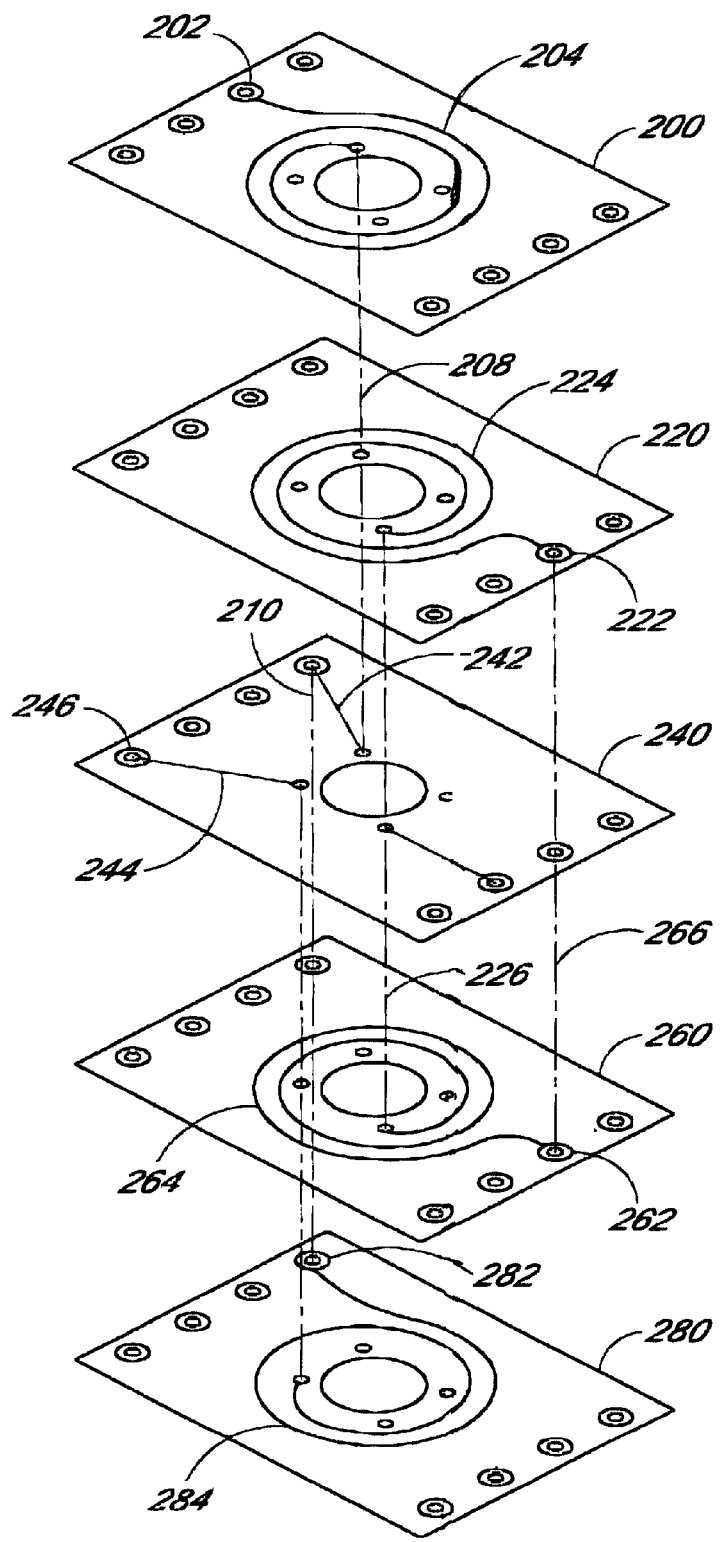
FIG. 2 is an exploded perspective view of layers of a PCB used in a magnetic component.

Each PCB can comprise single or multiple layers such as, for example, four or six layers. Each PCB includes an individual winding (either primary or secondary) with a predetermined number of turns. These windings are formed on the layers and can be formed using the conventional technology described above with reference to FIG. 2. As a result, new designs with different turn ratios can be configured in a short time by simply replacing a particular four or six layer PCB with another PCB with different turn ratios. Alternatively, with additional traces etched on the main board 590, the secondary windings can be connected in series or in parallel as described below to further configure the turn ratio according to user-defined needs. This flexibility in permitting user-configuration with a reduced number of layers of PCBs helps to reduce the overall cost of the component.

Figure 9A:
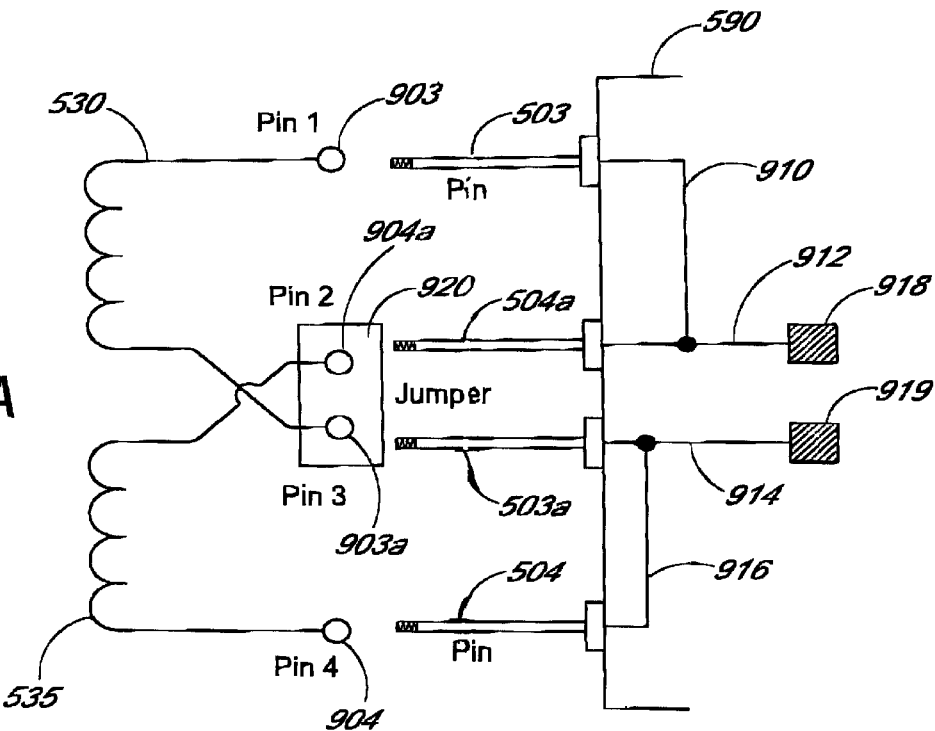
FIG. 9A is a schematic diagram of the equivalent circuit of the magnetic component of FIG. 5 configured in a series connection.
Figure 9B:
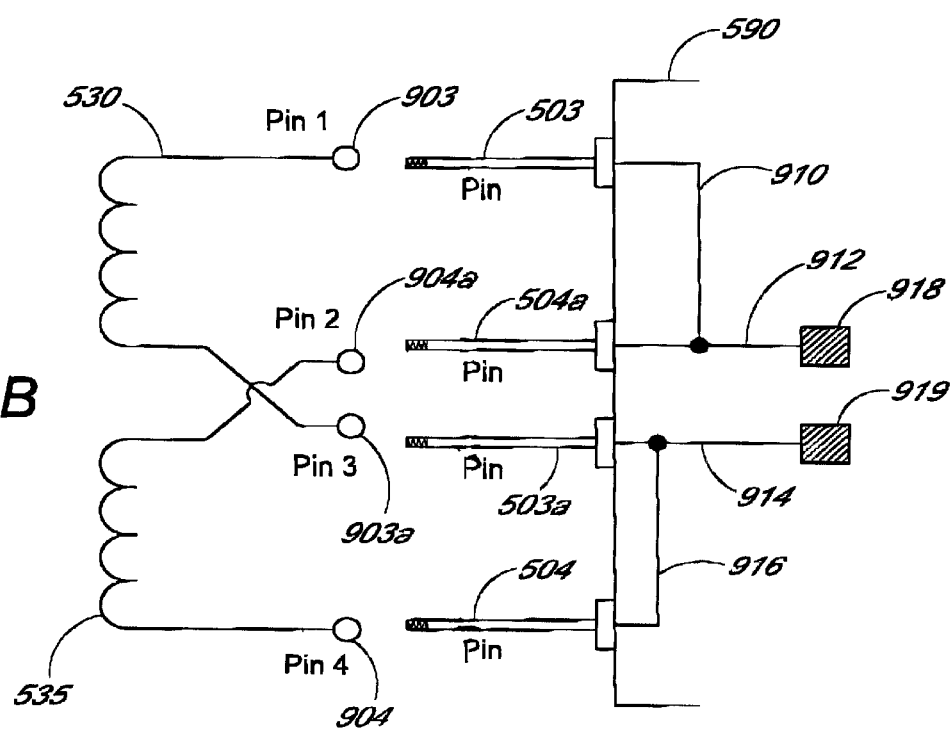
FIG. 9B is a schematic diagram of the equivalent circuit of the magnetic component of FIG. 5 configured in a parallel connection.

As shown in FIGS. 9A and 9B, several terminals can be used to connect the pins of the secondary PCBs 530 and 535. Specifically, for example, pin 503 can be used to connect a terminal 903 to the main board 590, pin 503A can be used to connect a terminal 903A to the main board 590, pin 504 can be used to connect a terminal 904 to the main board 590, and pin 504A can be used to connect a terminal 904A to the main board 590. The terminals 903, 903A, 904, and 904A can be connected to the various outside terminals of the windings embedded in secondary PCBs 530 and 535. Additional traces 910, 912, 914 and 916 are etched on the main board 590 and connect pins 503, 503A, 504, and 504A to output terminals 918 and 920 as shown in FIGS. 9A and 9B.

In FIG. 9A, a series configuration is depicted whereby by a connection in the form of a jumper 920 joins the windings of secondary PCB 530 with the windings of secondary PCB 535 by connecting terminals 903A and 904A. Pins 503 and 504 connect terminals 903 and 904 (of secondary PCB's 530 and 535, respectively) to the main board 590 (pins 503A and 504A are not connected in this configuration). Due to the jumper 920 connection, the secondary windings 530 and 535 are electrically connected in series and offer double the turn ratio for the transformer. In FIG. 9B, the jumper 820 is disconnected. Pins 503A and 504A connect terminals 903A and 904A (of secondary PCB's 530 and 535, respectively) to the main board 590. As a result the secondary windings are electrically in parallel.

Alternatively, the jumper 920 can be replaced or enhanced by a hardware or software configuration on the main board. For example, an electronic switch can be configured to control the jumper 920 connection or the jumper 920 could be replaced by a hardwired jumper on the main board 110.

Figure 3:
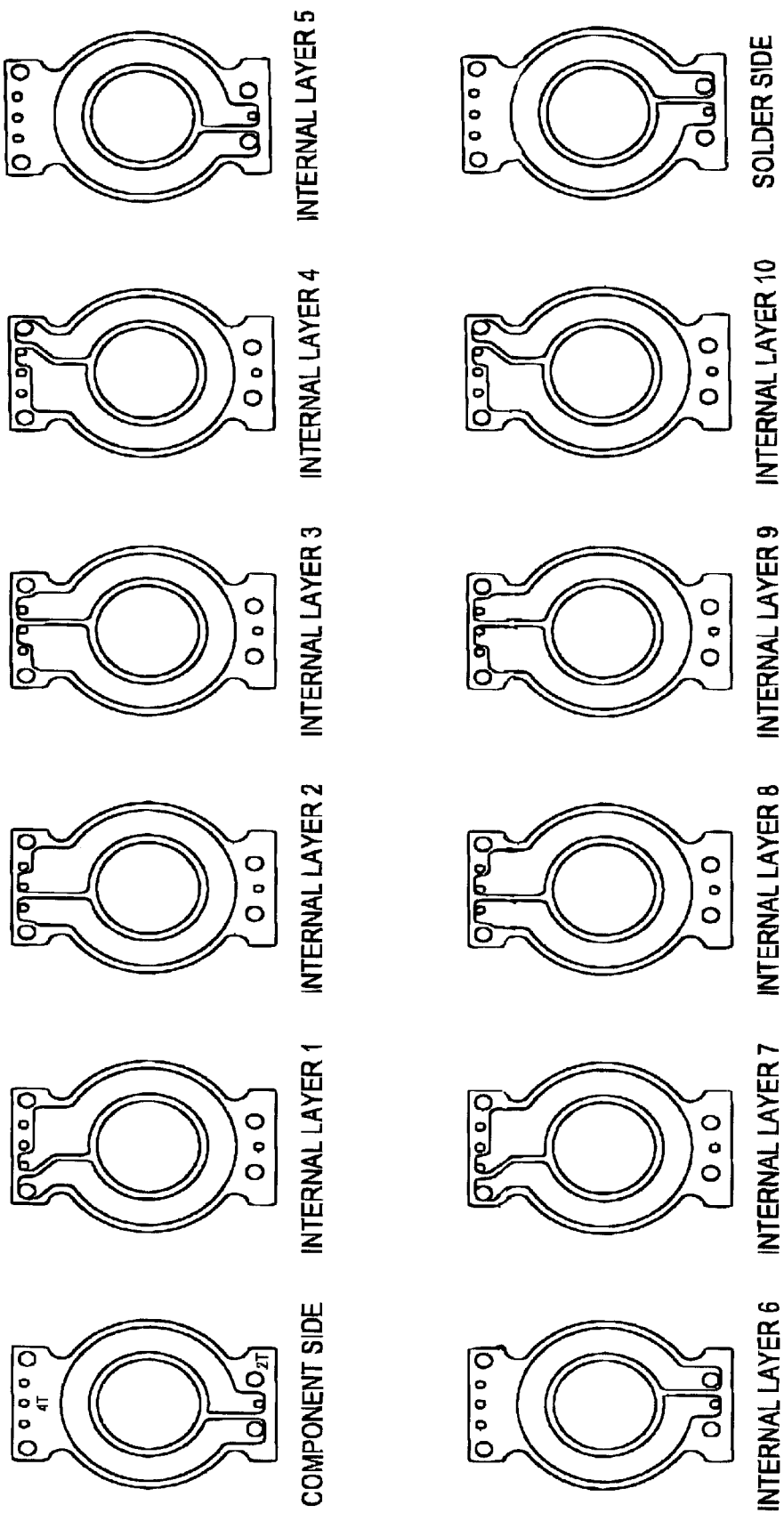
FIG. 3 is a top view of the multiple layers of the magnetic component of FIG. 1A.
Figure 4:
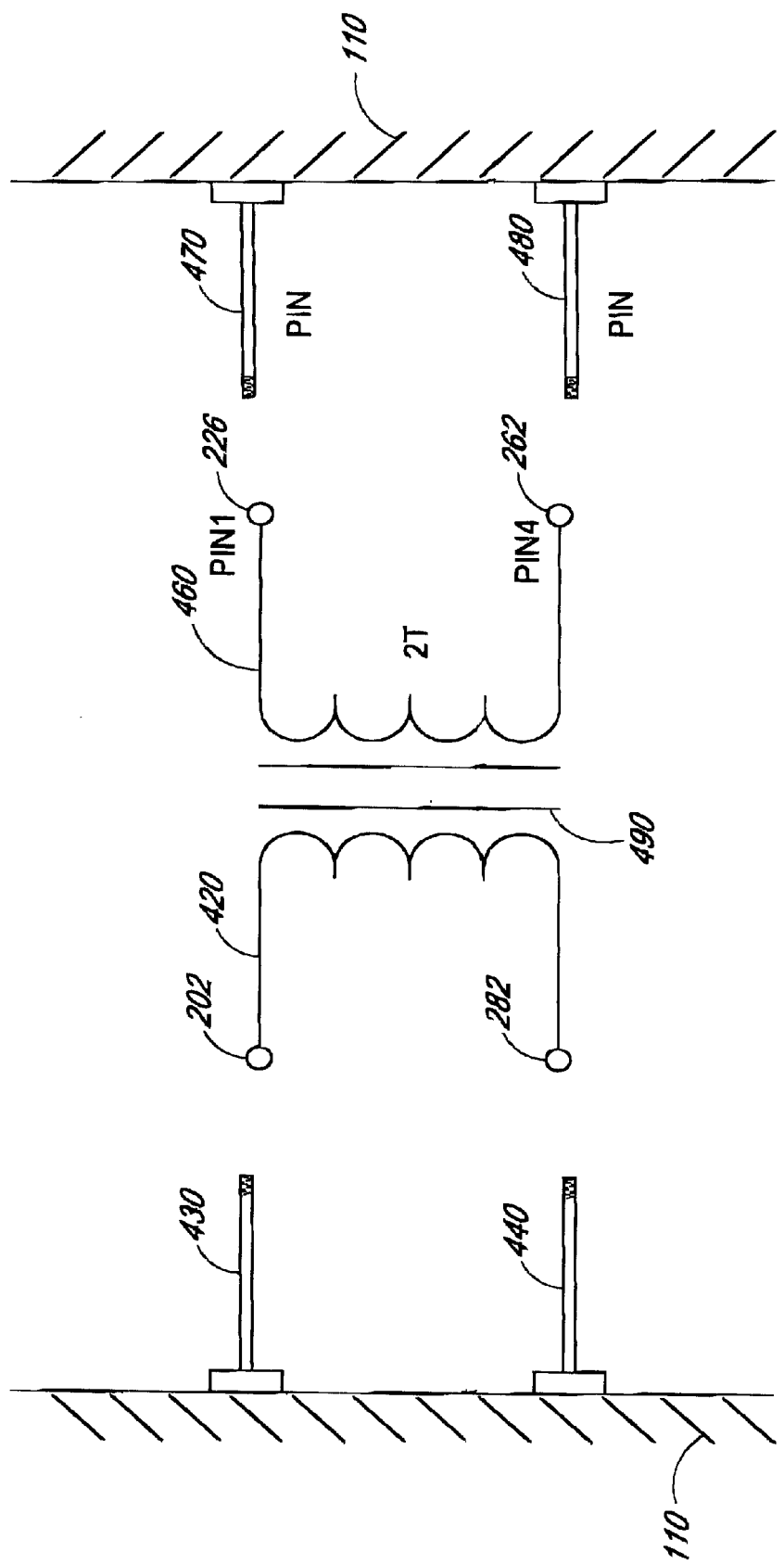
FIG. 4 is a schematic diagram of the equivalent circuit of the magnetic component of FIG. 1A.

Recall that the conventional planar technology included both the primary and secondary winding in a single twelve layer PCB. Moreover, the configuration of conventional windings (e.g., whether in parallel or in series) was predetermined by the particular connections used for the traces. Consequently, in order to change the turn ratios or parameters of the conventional magnetic component, a new PCB would need to be designed and manufactured. The stackable and user-configurable layout of the above embodiment overcomes this longstanding problem in the industry by providing several distinct advantages. For example, as described above, the arrangement allows a user to configure the component in such a way as to alter its turn ratios and thereby avoid the high costs of re-design and re-fabrication of a brand new component. Moreover, the offset configuration effectively eliminates the opportunity for flashover common in the current planar technology. Additionally, this arrangement replaces the traditional twelve layer board previously described by using a combination of a three, four, and six layer boards, which are much easier and less costly to make than the twelve layer board. This arrangement can be accomplished using the standardized, conventional designs of FIG. 3 and as a result, several different configurations can be made without invoking the design layout process.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. For example, the embodiment described contained a device with three PCBs; more or fewer PCBs are envisioned as within the scope of the invention.

What is claimed is:

1. An electrical device comprising:
   a plurality of printed circuit boards configured into a multi-layer configuration;
   at least a first printed circuit board of said plurality of printed circuit boards comprising a primary winding of a transformer;
   at least a second printed circuit board of said plurality of printed circuit boards comprising a secondary winding of the transformer; and
   a plurality of connector pins, wherein each pin of the plurality of connector pins is configured to electrically connect to either the primary winding or the secondary winding, wherein each pin of the plurality of connector pins penetrates only the at least one first printed circuit board or the at least one second printed circuit board, and wherein at least two of said first and second printed circuit boards are configured to receive at least one external jumper for externally connecting said configured first and second printed circuit boards in series or in parallel.

2. The device of claim 1, wherein the at least one first printed circuit board and the at least one second printed circuit board are electrically separated from each other.

3. The device of claim 1, further comprising a connector configured to connect the winding on at least two of the plurality of printed circuit boards in either a parallel or a series electrical configuration.

4. The device of claim 1, wherein each of the plurality of printed circuit boards comprises a multi-layer board.

5. The device of claim 1, further comprising a main circuit board, wherein the connector pins connect the windings on the plurality of printed circuit boards to the main circuit board.

6. An electrical device comprising:
   a plurality of core members;
   a plurality of printed circuit boards configured to be stackable in a multi-layer configuration between the core members:
   at least a first printed circuit board of the plurality of printed circuit boards comprising a primary winding of a transformer;
   at least a second printed circuit board of the plurality of printed circuit boards comprising a secondary winding of the transformer;
   an external jumper configured to selectably connect the winding on at least two of the plurality of printed circuit boards in either a parallel or a series electrical configuration; and
   a plurality of connector pins configured to electrically connect the windings on the plurality of printed circuit boards to a main circuit board, wherein each pin of the plurality of connector pins penetrates only the at least one first printed circuit board or the at least one second printed circuit board.

7. The device of claim 6, wherein each of the plurality of printed circuit boards comprises four to six layers.

8. The device of claim 6, wherein the at least one first printed circuit board and the at least one second printed circuit board are electrically separated from each other.

9. The device of claim 6, wherein said device is configured to function as a transformer.

10. An electrical device comprising:

a plurality of core members;

a plurality of printed circuit boards, positioned between the plurality of core members, with each printed circuit board having a plurality of layers, wherein the plurality of printed circuit boards are stackable into a multi-layer configuration;

at least one coil defined on each of the plurality of layers of the plurality of printed circuit boards;

at least a first printed circuit board of the plurality of printed circuit boards comprising a primary winding of a transformer;

at least a second printed circuit board of the plurality of printed circuit boards comprising a secondary winding of a transformer;

an external jumper configured to connect the windings on at least two of the plurality of printed circuit boards in either a parallel or a series electrical configuration; and a plurality of connector pins configured to electrically connect the plurality of printed circuit boards to the main circuit board, wherein each pin of the plurality of connector pins penetrates only the at least first printed circuit board of the plurality of printed circuit boards comprising the primary winding or the at least second printed circuit board of the plurality of printed circuit boards comprising the secondary winding.

11. An electrical device comprising:

a plurality of printed circuit boards, each printed circuit board having a plurality of layers, wherein the plurality of printed circuit boards are stackable into a multi-layer configuration;

at least one coil defined on each of the plurality of layers of the plurality of printed circuit boards;

means for configuring electrical connections on the plurality of printed circuit boards to include the at least one coil on each printed circuit board so as to define a primary winding and a secondary winding;

means for connecting the primary winding on the printed circuit boards and the secondary winding on the printed circuit boards to a main circuit board with connector pins in such a manner that the connector pins connecting the primary winding only penetrate printed circuit boards containing said primary winding end connector pins connecting the secondary winding only penetrate printed circuit boards containing said secondary winding; and means for externally connecting the winding on at least two of the plurality of printed circuit boards in either a parallel or a series electrical configuration.

* * * * *